(12) United States Patent
Zhang et al.

(10) Patent No.: US 8,853,025 B2
(45) Date of Patent: Oct. 7, 2014

(54) FINFET/TRI-GATE CHANNEL DOPING FOR MULTIPLE THRESHOLD VOLTAGE TUNING

(71) Applicant: Taiwan Semiconductor Manufacturing Company, Ltd., Hsin-Chu (TW)

(72) Inventors: Ying Zhang, Hsin-Chu (TW); Ziwei Fang, Hsin-Chu (TW); Jeffrey Junhao Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 63 days.

(21) Appl. No.: 13/763,280

(22) Filed: Feb. 8, 2013

(65) Prior Publication Data
US 2014/0227850 A1   Aug. 14, 2014

(51) Int. Cl.
*H01L 21/8238* (2006.01)
*H01L 29/66* (2006.01)

(52) U.S. Cl.
CPC ............................... *H01L 29/66545* (2013.01)
USPC ........... 438/217; 438/156; 438/157; 438/173; 438/194; 438/268; 438/270; 438/283

(58) Field of Classification Search
CPC .............. H01L 21/845; H01L 27/0924; H01L 27/1211
USPC ......... 438/156, 157, 173, 194, 217, 268, 270, 438/283
See application file for complete search history.

(56) References Cited

U.S. PATENT DOCUMENTS

| | | | |
|---|---|---|---|
| 7,449,373 B2 * | 11/2008 | Doyle et al. | 438/149 |
| 7,972,914 B2 * | 7/2011 | Kim et al. | 438/173 |
| 8,313,999 B2 * | 11/2012 | Cappellani et al. | 438/283 |
| 8,415,216 B2 * | 4/2013 | Anderson et al. | 438/217 |
| 8,518,781 B2 * | 8/2013 | Fumitake | 438/282 |
| 8,618,636 B1 * | 12/2013 | Chang et al. | 257/565 |
| 8,697,523 B2 * | 4/2014 | Cai et al. | 438/283 |

OTHER PUBLICATIONS

Lin, C-H, et al., "Channel Doping Impact on FinFETS for 22nm and Beyond," 2012 Symposium on VLSI Technology Digest of Technical Papers (VLSIT), pp. 15-16.

* cited by examiner

*Primary Examiner* — Bac Au
(74) *Attorney, Agent, or Firm* — Slater and Matsil, L.L.P.

(57) ABSTRACT

An embodiment method of controlling threshold voltages in a fin field effect transistor (FinFET) includes forming a dummy gate over a central portion of a fin, the central portion of the fin disposed between exterior portions of the fin unprotected by the dummy gate, removing the exterior portions of the fin and replacing the exterior portions of the fin with an epitaxially-grown silicon-containing material, applying a spin-on resist over the dummy gate and the epitaxially-grown silicon-containing material and then removing the spin-on resist over the hard mask of the dummy gate, etching away the hard mask and a polysilicon of the dummy gate to expose a gate oxide of the dummy gate, the gate oxide disposed over the central portion of the fin, and implanting ions into the central portion of the fin through the gate oxide disposed over the central portion of the fin.

20 Claims, 15 Drawing Sheets

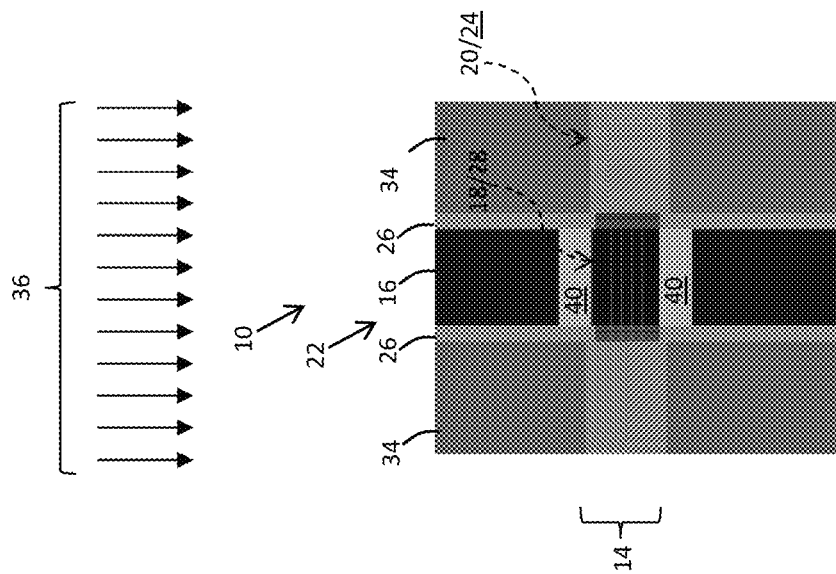
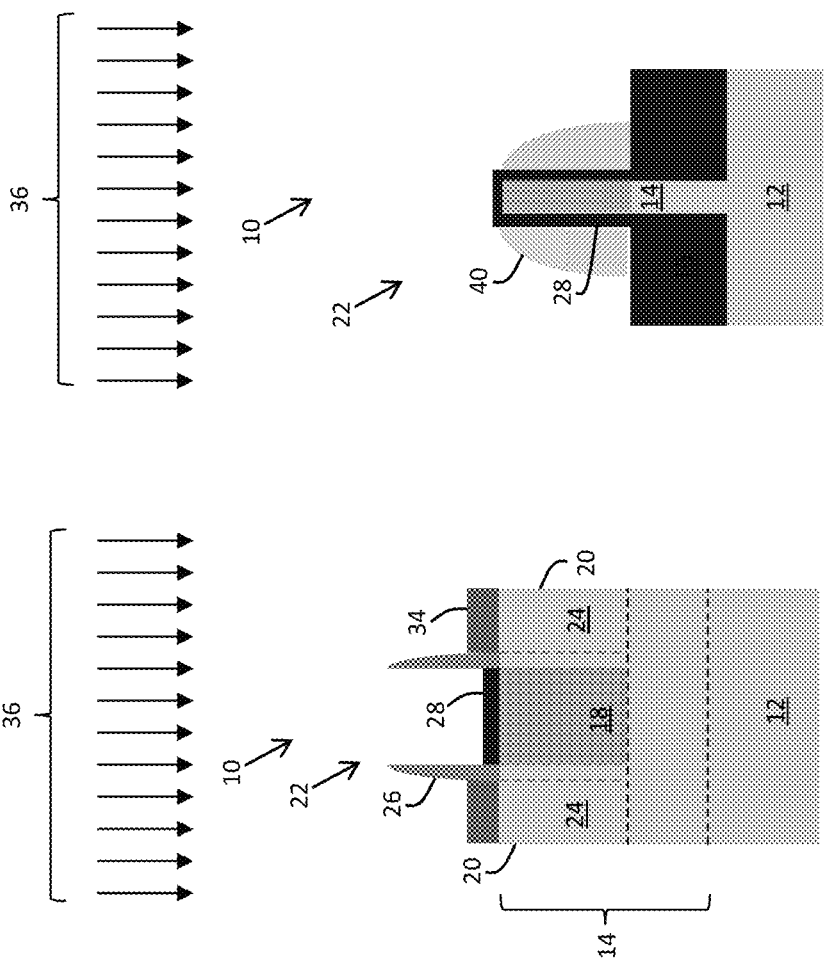

FINFET/TRI-GATE CHANNEL DOPING FOR MULTIPLE THRESHOLD VOLTAGE TUNING

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors are used in sub 32 nm transistor nodes. FinFETs not only improve areal density, but also improve gate control of the channel.

Multiple threshold voltages ($V_{th}$) are feasible for FinFET technology at 22 nanometer (nm) node geometries using a conventional channel doping method (e.g., through ion implantation and annealing).

One of the challenges faced when using conventional ion implantation prior to fin formation is the dopant loss in the subsequent process steps after fin has been formed due, at least in part, to the fins being relatively thin (e.g., 10-15 nm widths and 30-50 nm heights) with large surface to volume ratios. The dopant loss may cause random dopant fluctuations (RDF), which have a direct impact on threshold voltage controllability. Random dopant fluctuations may also be the result of a fin width/height variation, which will change the ratio of fin surface to fin volume.

For bulk silicon (Si) fins, another way of controlling multiple threshold voltages in FinFETs is to perform ion implantation after the fin has been formed. However, one of the challenges for this integration scheme is that after ion implantation an anneal step is needed to re-crystallize the fins. With free standing fins, which are amorphous after regular ion implantation at room temperature, the seed for re-crystallization of the fins is the remaining fin body inside of the oxide fillings. The re-crystallization process can introduce high levels of crystal lattice defects, which inevitably cause mobility degradation in fins.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 9A-9C illustrate cross sections and a top view of the embodiment FinFET of FIGS. 8A-8C during an ion implantation process;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a FinFET. The disclosure may also be applied, however, to other integrated circuits, electronic structures, and the like.

Figure 1:
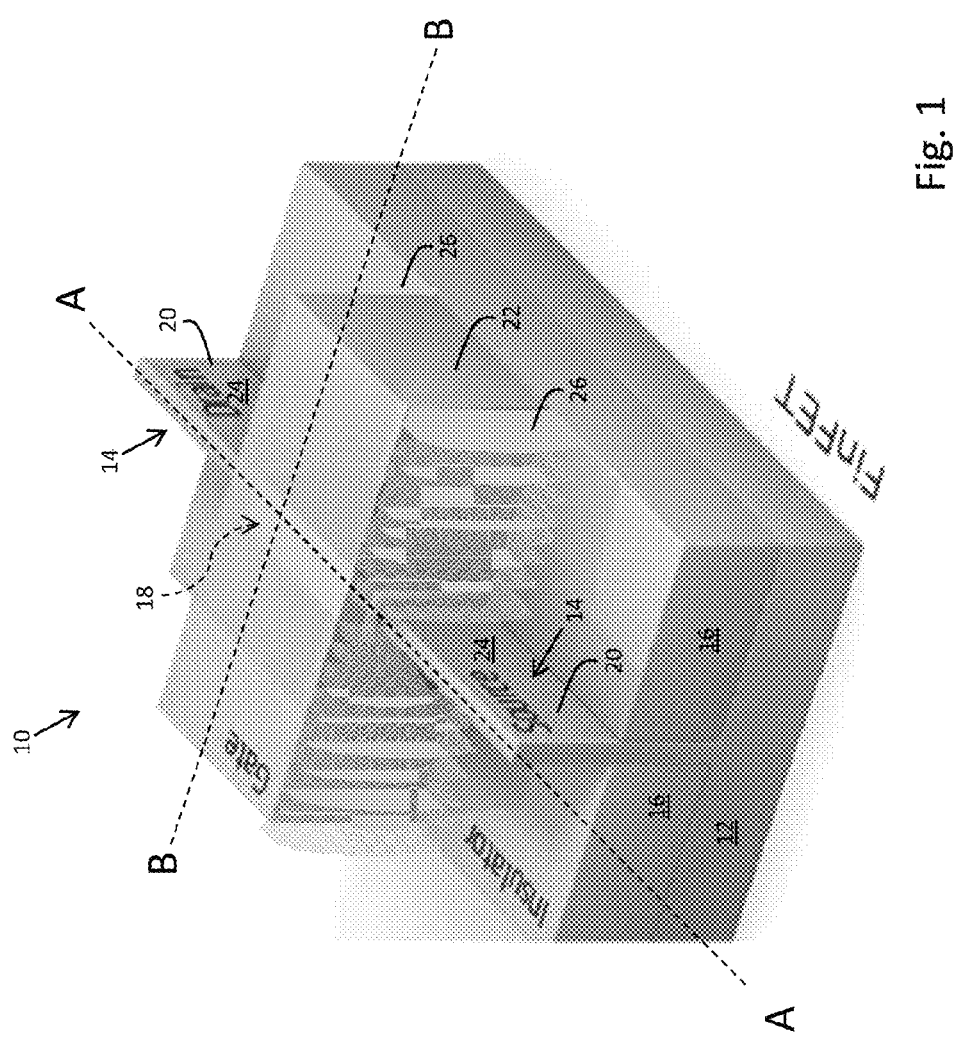
FIG. 1 is an embodiment FinFET.

Referring now to FIG. 1, an embodiment FinFET 10 is illustrated. As used herein, the embodiment FinFET 10 refers to and represents both a double-gate and a tri-gate device. As shown, the embodiment FinFET 10 includes a substrate 12 supporting a fin 14 disposed in an insulator 16. In an embodiment, the substrate 12 and a lower portion of the fin 14 are a bulk silicon or a silicon-containing material. In an embodiment, the insulator 16 is an oxide or represents a shallow trench isolation (STI) region.

The fin 14, which projects above the surface of the insulator 16, includes a central portion 18 between exterior portions 20. As shown in FIG. 1, the central portion 18 is protected by a dummy gate 22. In contrast, the exterior portions 20, which represent the source and the drain of the FinFET 10, are generally unprotected by, and generally adjacent to, the dummy gate 22.

In an embodiment, the exterior portions 20 of the fin 14, which were initially formed from bulk silicon, are removed and replaced by an epitaxially-grown silicon-containing material 24. In an embodiment, the epitaxially-grown silicon-containing material 24 comprises silicon germanium (SiGe) for a p-type FinFET (a.k.a., a pFET). In an embodiment, the epitaxially-grown silicon-containing material 24 comprises silicon with heavily doped carbon (SiC), silicon with heavily doped phosphorus (SiP), or a combination of both (SiCP) for an n-type FinFET (a.k.a., an nFET).

Still referring to FIG. 1, spacers 26 are disposed on opposing sides of the dummy gate 22. As shown, the spacers 26 generally abut the sides of the dummy gate 22 along its length on either side. Moreover, a portion of each of the spacers 26 passes over the top of the fin 14. In an embodiment, the spacers 26 are formed from a nitride or other suitable spacer material.

Figure 2C:
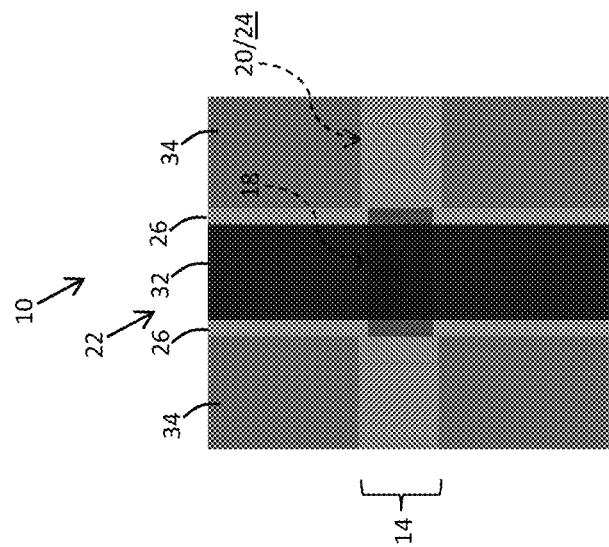
FIGS. 2A-2C illustrate cross sections and a top view of the embodiment FinFET of FIG. 1 when a hard mask of a dummy gate has been exposed.
Figure 2B:
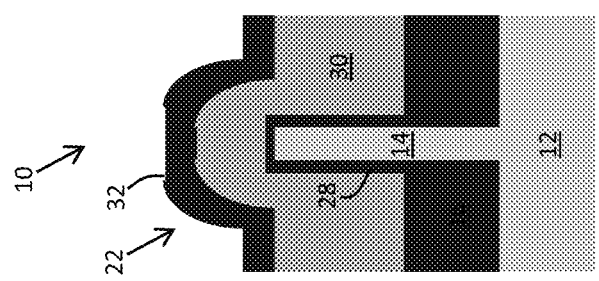
Figure 2A:
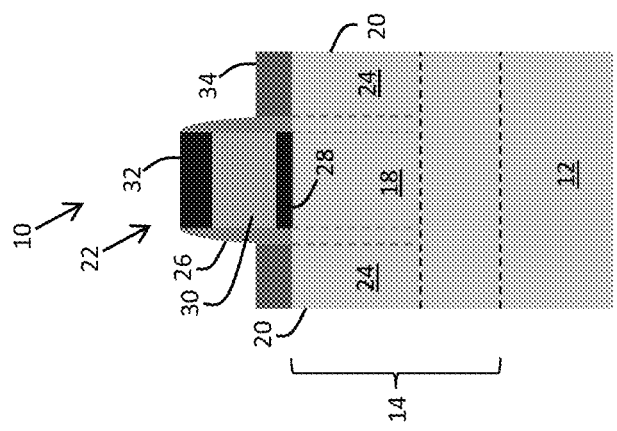

FIGS. 2A-2B illustrate cross sections of the embodiment FinFET 10 of FIG. 1, taken generally along line A-A and B-B, respectively. FIG. 2C illustrates a top view of the FinFET 10 of FIG. 1. As collectively shown in FIGS. 2A-2C, in an embodiment the dummy gate 22 comprises a gate oxide 28, a polysilicon layer 30, and a hard mask 32. As shown in FIG. 2B, the gate oxide 28 of the dummy gate 22 encapsulates or covers the central portion 18 of the fin 14. In an embodiment, a lightly-doped drain is formed in the fin 14 and protected, at least in part, by the gate oxide 28 of the dummy gate 22.

Referring now to FIGS. 2A-2C, the process flow for channel doping the FinFET 10 in a manner that promotes good control of threshold voltages begins. Indeed, after the central portion 18 of the fin 14 has been wrapped with the gate oxide 28 and the bulk silicon forming the exterior portions 20 of the fin 14 has been replaced with the epitaxially-grown silicon-containing material 24 (e.g., silicon germanium, silicon carbide, etc.), a spin-on resist 34 is applied. Thereafter, the spin-on resist 34 is suitably recessed or removed in order to expose the hard mask 32 of the dummy gate 22 as shown in FIG. 2A. In an embodiment, the spin-on resist 34 above the hard mask 32 is removed through chemical down-stream etching (CDE).

Figure 3C:
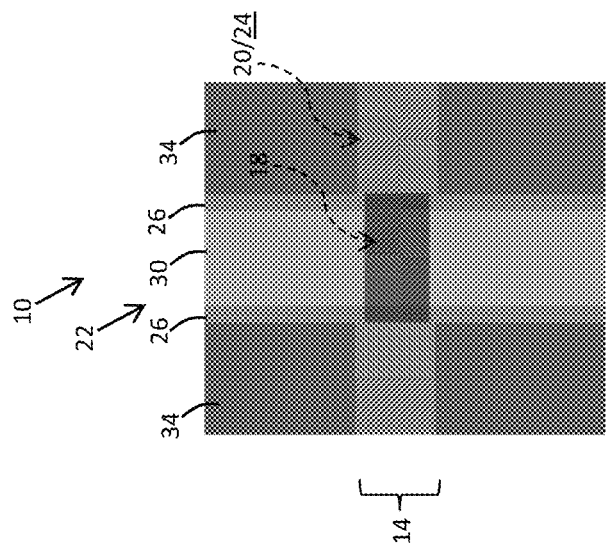
FIGS. 3A-3C illustrate cross sections and a top view of the embodiment FinFET of FIGS. 2A-2C after the hard mask of the dummy gate has been removed.
Figure 3B:
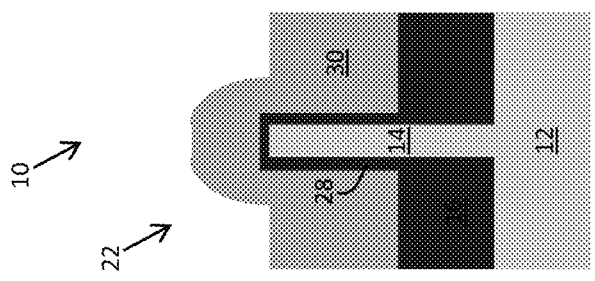
Figure 3A:
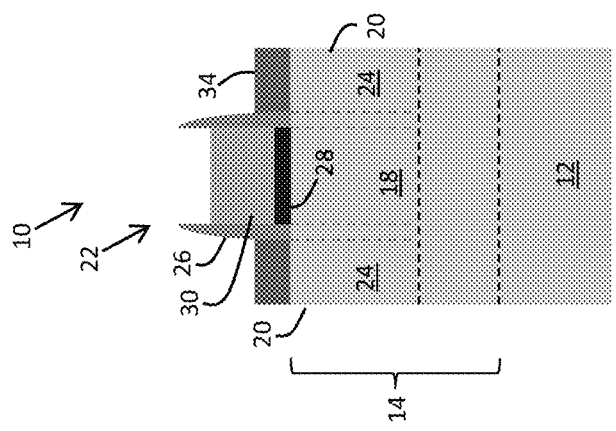

Referring now to FIGS. 3A-3C, after being exposed the hard mask 32 shown in FIGS. 2A-2C is removed. In an embodiment, the hard mask 32 is removed by etching. In an embodiment, the hard mask 32 is etched away through one of dry etching, wet etching, chemical down-stream etching (CDE), chemical oxide removal (COR), and combinations thereof. By removing the hard mask 32, the underlying polysilicon layer 30 is exposed.

Figure 4A:
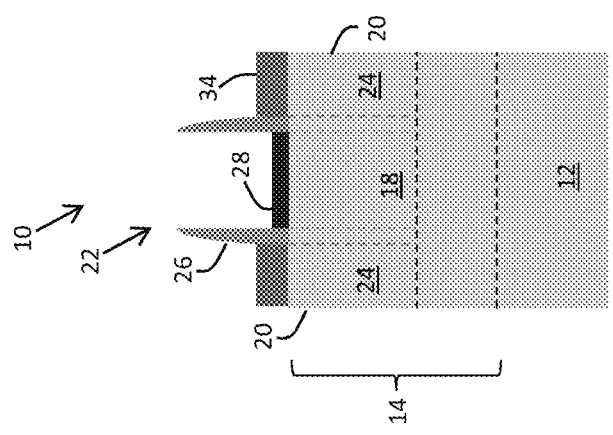
FIGS. 4A-4C illustrate cross sections and a top view of the embodiment FinFET of FIGS. 3A-3C after a polysilicon of the dummy gate has been removed.
Figure 4B:
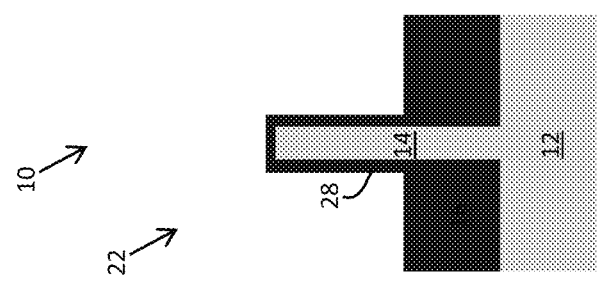
Figure 4C:
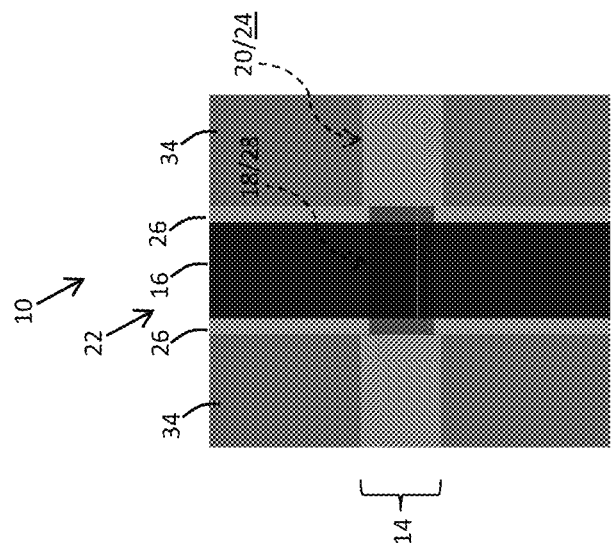

Referring now to FIGS. 4A-4C, after the hard mask 32 shown in FIGS. 2A-2C has been removed, the polysilicon layer 30 is removed. In an embodiment, the polysilicon layer 30 of the dummy gate 22 is removed through one of dry etching, wet etching, chemical down-stream etching (CDE), and combinations thereof. By removing the polysilicon layer 30, the gate oxide 28 protecting the central portion 18 of the fin 14 is exposed.

Figures 5A, 5B, 5C:
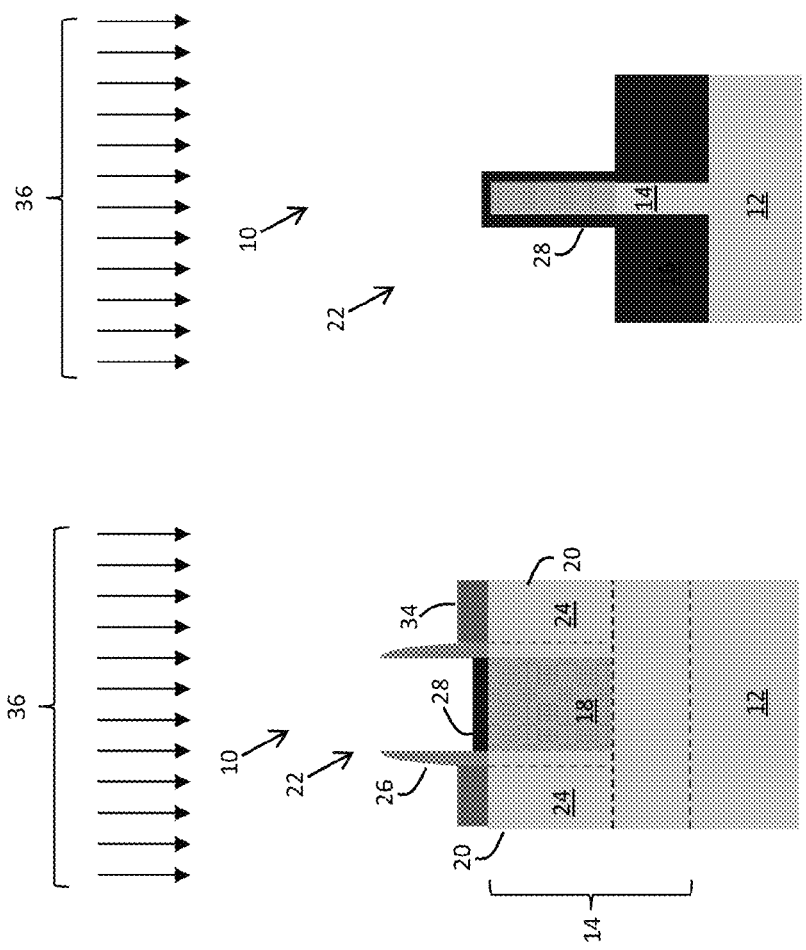
FIGS. 5A-5C illustrate cross sections and a top view of the embodiment FinFET of FIGS. 4A-4C during an ion implantation process.

Referring now to FIGS. 5A-5C, after the polysilicon layer 30 shown in FIGS. 4A-4C has been removed and the gate oxide 28 exposed, an ion implantation 36 is performed. Indeed, ions are implanted into the central portion 18 of the fin 14 through the gate oxide 28 disposed over the central portion 18 of the fin 14. In an embodiment, the ion implantation 36 is performed at a temperature of between about 25° C. (i.e., room temperature) and about 600° C. In an embodiment, the ion implantation 36 employs n-type dopants or p-type dopants. In an embodiment, the ion implantation 36 has a normal incidence, i.e., the ion beam is perpendicular to the wafer surface. In an embodiment, the ion implantation 36 has an angled or tilted incidence. Indeed, a variety of different angles may be used to place dopant atoms in a desired location.

Because the ions being implanted in the central portion 18 of the fin 14 have to pass through the gate oxide 28, the dopant level or concentration may be more precisely controlled. Moreover, there is less dopant loss due to the fin-doping last integration scheme. In other words, there are fewer process steps between the ion implantation 36 and fully filling by gate last integration schemes.

Figure 6C:
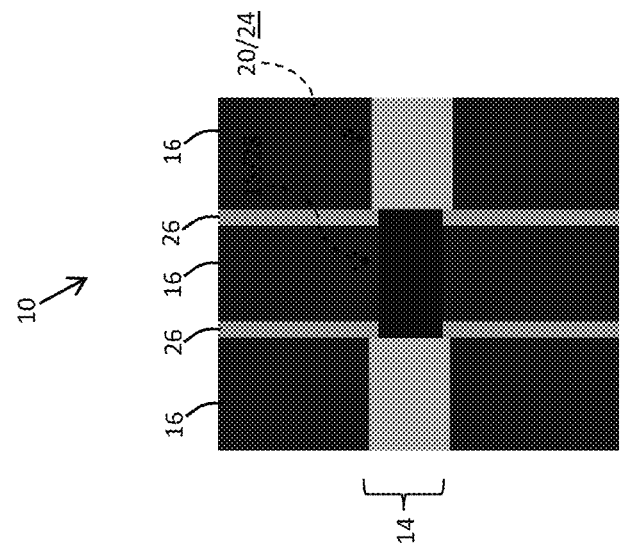
FIGS. 6A-6C illustrate cross sections and a top view of the embodiment FinFET of FIGS. 5A-5C after any remaining spin-on resist has been removed.
Figure 6B:
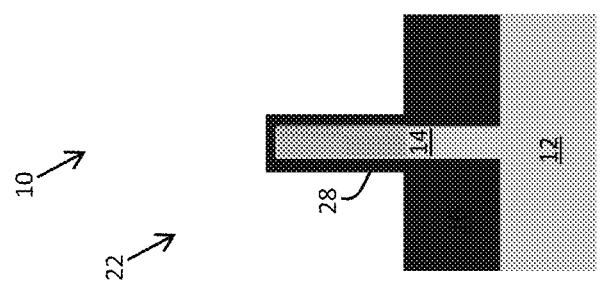
Figure 6A:
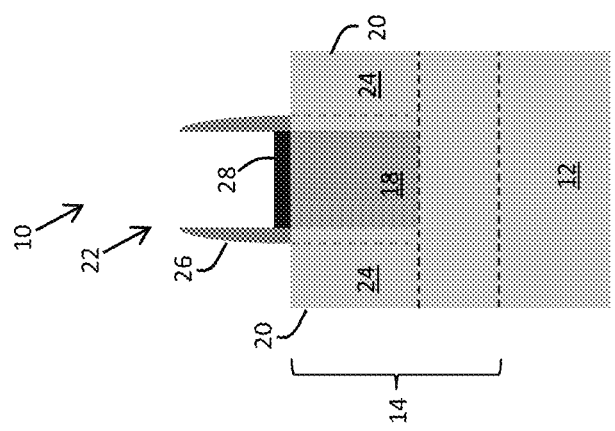
Figure 7C:
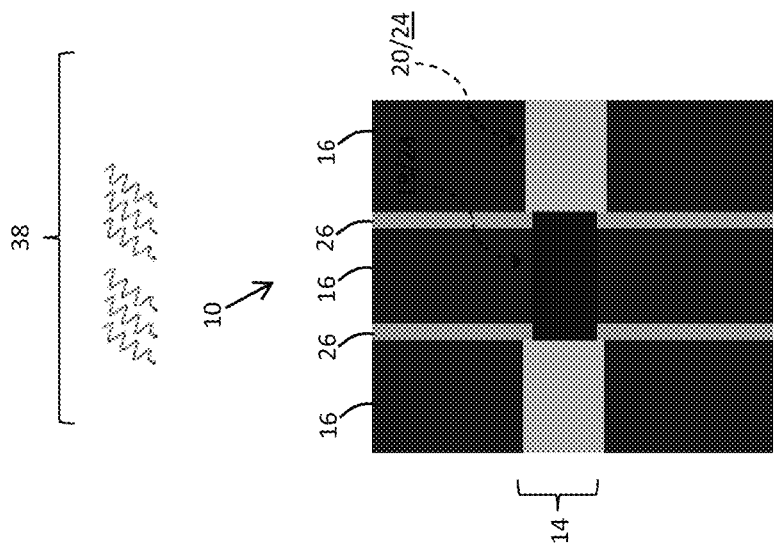
FIGS. 7A-7C illustrate cross sections and a top view of the embodiment FinFET of FIGS. 6A-6C after an annealing process has been performed to repair residual damage in the fin.
Figure 7B:
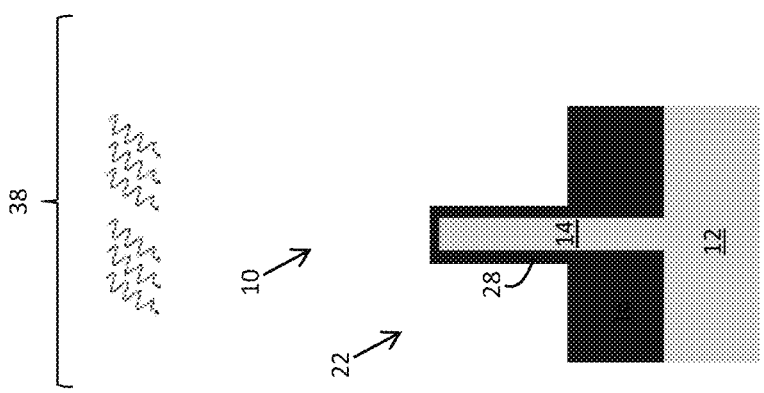
Figure 7A:
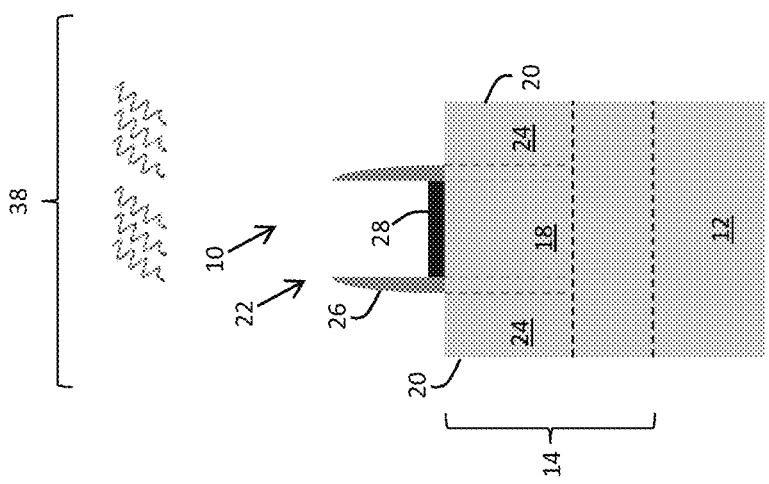

Referring now to FIGS. 6A-6C, any of the spin-on resist 34 (see FIGS. 5A-5C) remaining after the ion implantation 36 is removed. Thereafter, as shown in FIGS. 7A-7C, an annealing process 38 is performed to repair residual damage in the fin 14. In an embodiment, the annealing process 38 is performed for between about one microsecond (1 μs) and about ten seconds (10 s) at a temperature of between about 800° C. and about 1200° C. In an embodiment, the annealing process 38 is performed immediately after the ion implantation 36 in an effort to repair fin 14 damage as well as to activate dopant atoms.

Figure 8C:
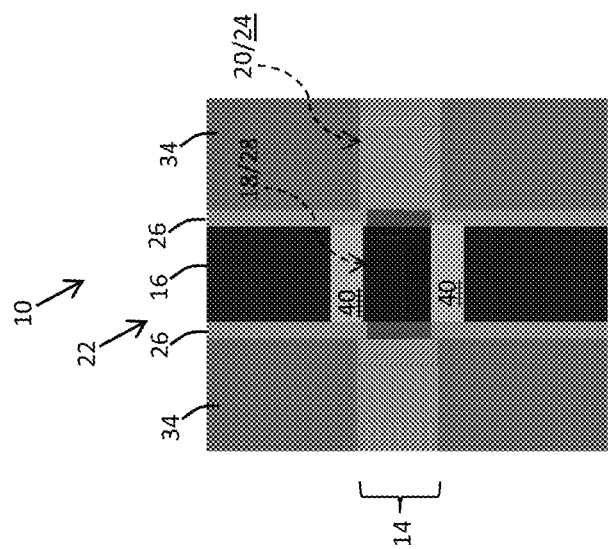
FIGS. 8A-8C illustrate cross sections and a top view of the embodiment FinFET of FIGS. 3A-3C after a portion of the polysilicon of the dummy gate has been removed to form spacers.
Figure 8B:
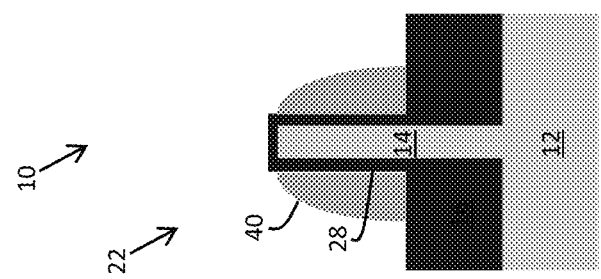
Figure 8A:
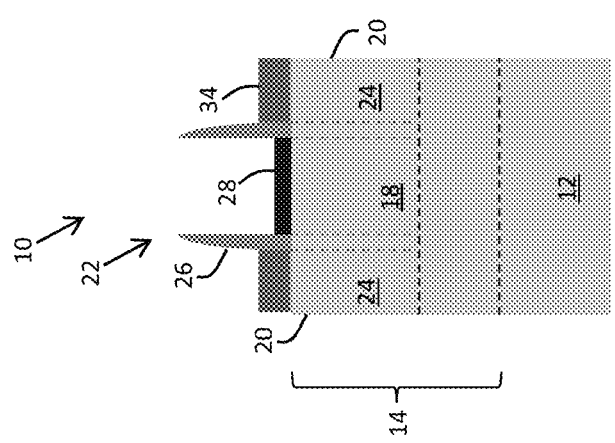

Referring now to FIGS. 8A-8C, instead of removing the entire polysilicon layer 30 as shown FIGS. 3A-3C, only a portion of the polysilicon layer 30 is removed to form polysilicon spacers 40. As shown, the polysilicon spacers 40 abut the gate oxide 28 and serve to protect the central portion 18 of the fin 14. Referring now to FIGS. 9A-9C, after the polysilicon spacers 40 have been formed, the ion implantation 36 is performed. As before, ions are implanted into the central portion 18 of the fin 14 through the gate oxide 28 disposed over the central portion 18 of the fin 14.

Figure 10C:
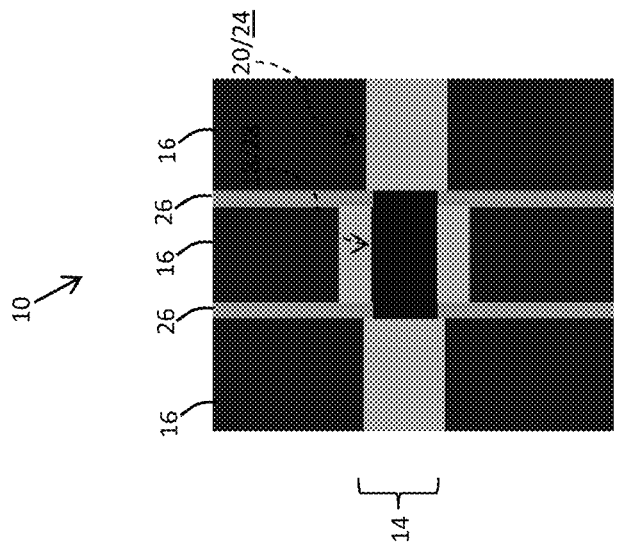
FIGS. 10A-10C illustrate cross sections and a top view of the embodiment FinFET of FIGS. 9A-9C after any remaining spin-on resist has been removed.
Figure 10B:
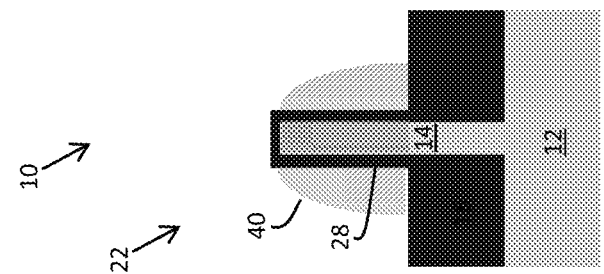
Figure 10A:
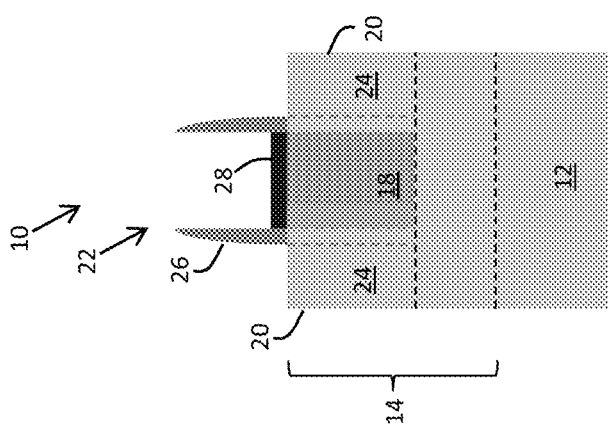
Figure 11C:
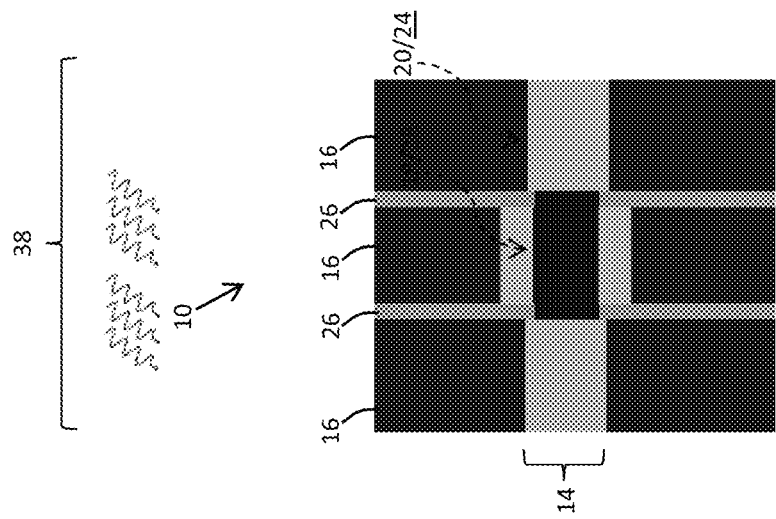
FIGS. 11A-11C illustrate cross sections and a top view of the embodiment FinFET of FIGS. 10A-10C after an annealing process has been performed to repair residual damage in the fin.
Figure 11B:
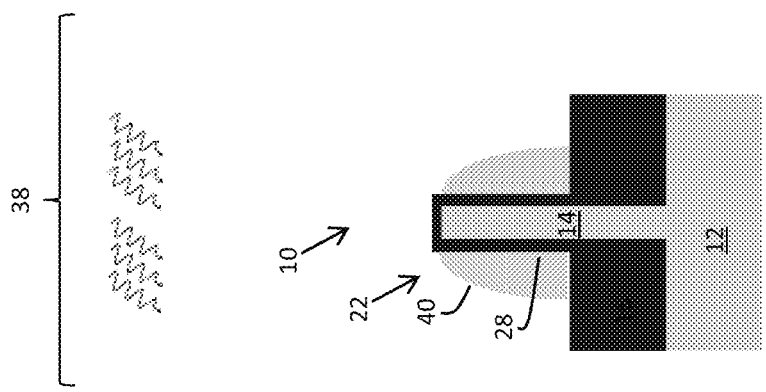
Figure 11A:
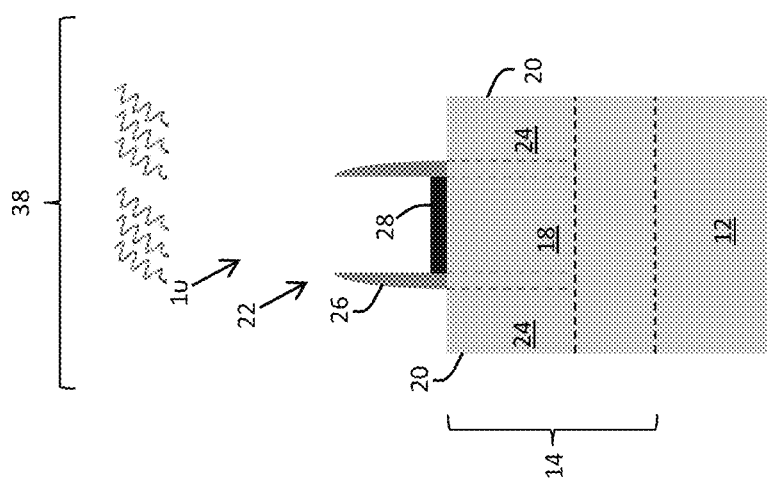

Referring now to FIGS. 10A-10C, any of the spin-on resist 34 (see FIGS. 9A-9C) remaining after the ion implantation 36 is removed. Thereafter, as shown in FIGS. 11A-11C, an annealing process 38 is performed to repair residual damage in the fin 14. In an embodiment, the polysilicon spacers 40 minimize dopant loss during the annealing process. By way of example, for ion implantation with a normal incidence, which is used after the polysilicon spacer 40 is formed, both the fin 14 and the polysilicon spacers 40 are doped with about same dopant concentration. Dopant out-diffusion during the annealing process is suppressed compared to when the polysilicon spacers 40 are not used. Therefore, a lesser implant dose is allowed to be used to achieve the same doping concentration within the fin 14.

Figure 12C:
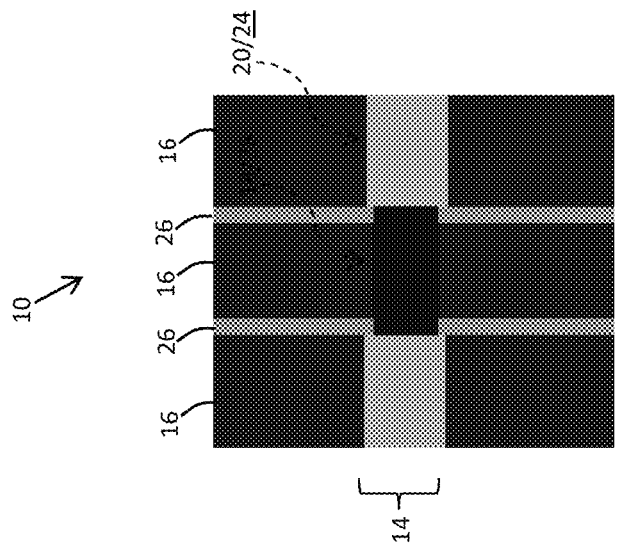
FIGS. 12A-12C illustrate cross sections and a top view of the embodiment FinFET of FIGS. 11A-11C after the spacers have been removed.
Figure 12B:
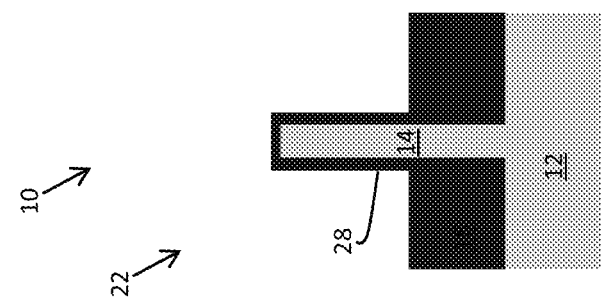
Figure 12A:
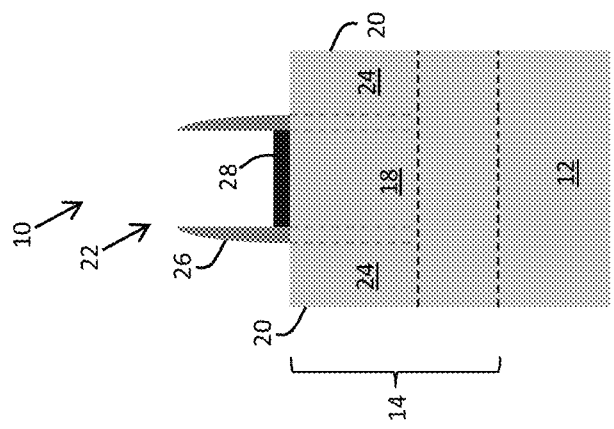

Next, as depicted in FIGS. 12A-12C, the polysilicon spacers 40 are removed. In an embodiment, the polysilicon spacers 40 are removed through one of dry etching, wet etching, chemical down-stream etching, and combinations thereof.

In an embodiment, after the ion implantation 36 shown in FIGS. 5A-5C, a dummy polysilicon layer 30 (as shown, for example, in FIGS. 3A-3C) may be formed over the gate oxide 28 prior to the annealing process 38 of FIGS. 7A-7C in an effort to protect the fin 14 from residual damage. In an embodiment, such a dummy polysilicon layer 30 would be formed instead of the polysilicon spacers 40.

Figure 13:
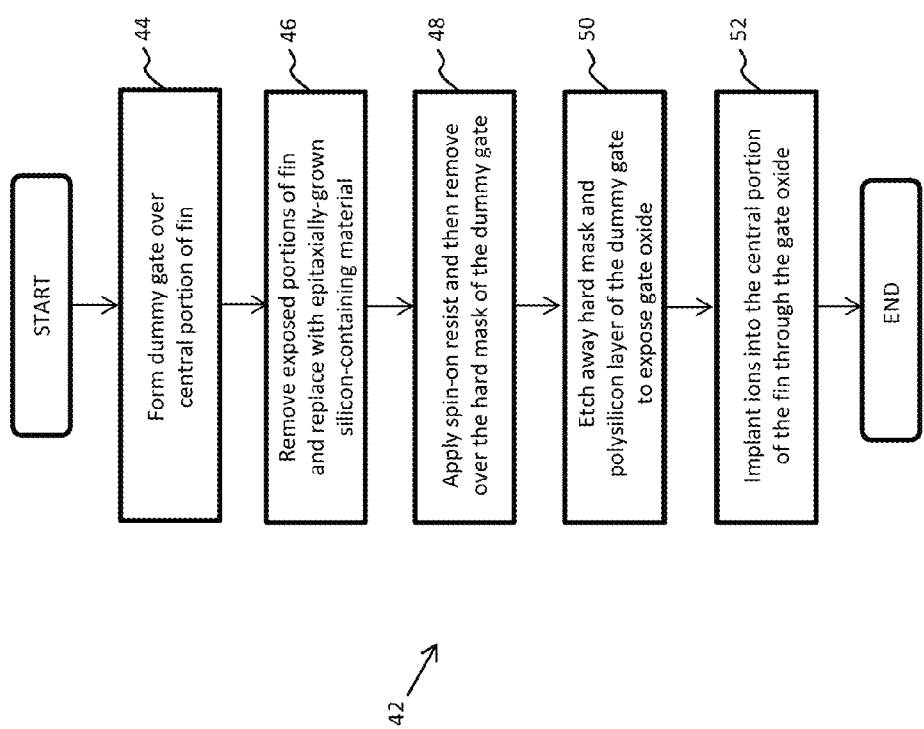
FIG. 13 illustrates an embodiment method of controlling threshold voltages in a fin field effect transistor (FinFET)

Referring now to FIG. 13, an embodiment method 42 of controlling threshold voltages in the FinFET 10 is illustrated. In block 44, the dummy gate 22 is formed over the central portion of the fin 14. As shown in FIG. 1, the central portion 18 of the fin 14 is disposed between exterior portions 20 of the fin unprotected by the dummy gate 22. In block 46, the exterior portions 20 of the fin 14 are removed and replaced with an epitaxially-grown silicon-containing material 24.

In block 48, a spin-on resist 34 is applied over the dummy gate 22 and the epitaxially-grown silicon-containing material 24 and then removed over the hard mask 32 of the dummy gate 22. In block 50, the hard mask 32 and the polysilicon layer 30 of the dummy gate 22 are etched away to expose the gate oxide 28 of the dummy gate 22. As shown in FIG. 1, the gate oxide 28 is disposed over the central portion 18 of the fin 14. In block 52, ions are implanted into the central portion 18 of the fin 14 through the gate oxide 28 disposed over the central portion 18 of the fin 14. As noted above, any of the spin-on resist 34 remaining after the ions have been implanted may be removed and an annealing process to repair residual damage in the fin may be performed.

Figure 14:
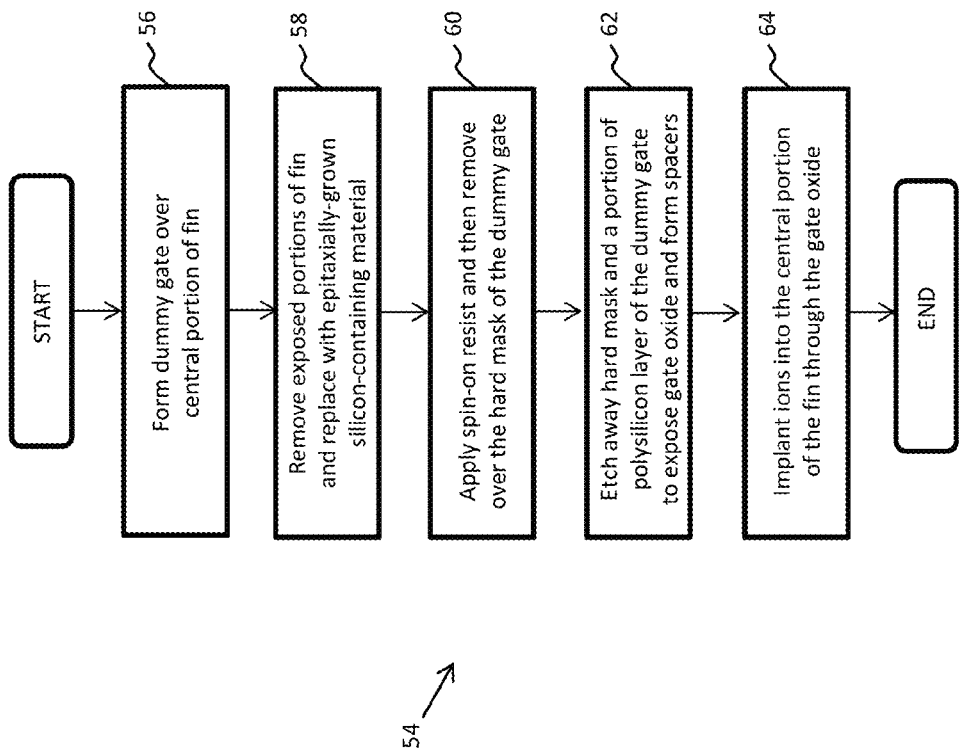
FIG. 14 illustrates an embodiment method of controlling threshold voltages in a fin field effect transistor (FinFET)

Referring now to FIG. 14, an embodiment method 54 of controlling threshold voltages in the FinFET 10 is illustrated. In block 56, the dummy gate 22 is formed over the central portion of the fin 14. As shown in FIG. 1, the central portion 18 of the fin 14 is disposed between exterior portions 20 of the fin unprotected by the dummy gate 22. In block 58, the exterior portions 20 of the fin 14 are removed and replaced with an epitaxially-grown silicon-containing material 24.

In block 60, a spin-on resist 34 is applied over the dummy gate 22 and the epitaxially-grown silicon-containing material 24 and then removed over the hard mask 32 of the dummy gate 22. In block 62, the hard mask 32 and a portion of the polysilicon layer 30 of the dummy gate 22 are etched away to expose the gate oxide 28 of the dummy gate 22 and to form the polysilicon spacers 40. As shown in FIG. 1, the gate oxide 28 is disposed over the central portion 18 of the fin 14. In block 64, ions are implanted into the central portion 18 of the fin 14 through the gate oxide 28 disposed over the central portion 18 of the fin 14. As noted above, any of the spin-on resist 34 remaining after the ions have been implanted may be removed and an annealing process to repair residual damage in the fin 14 may be performed.

Figure 15:
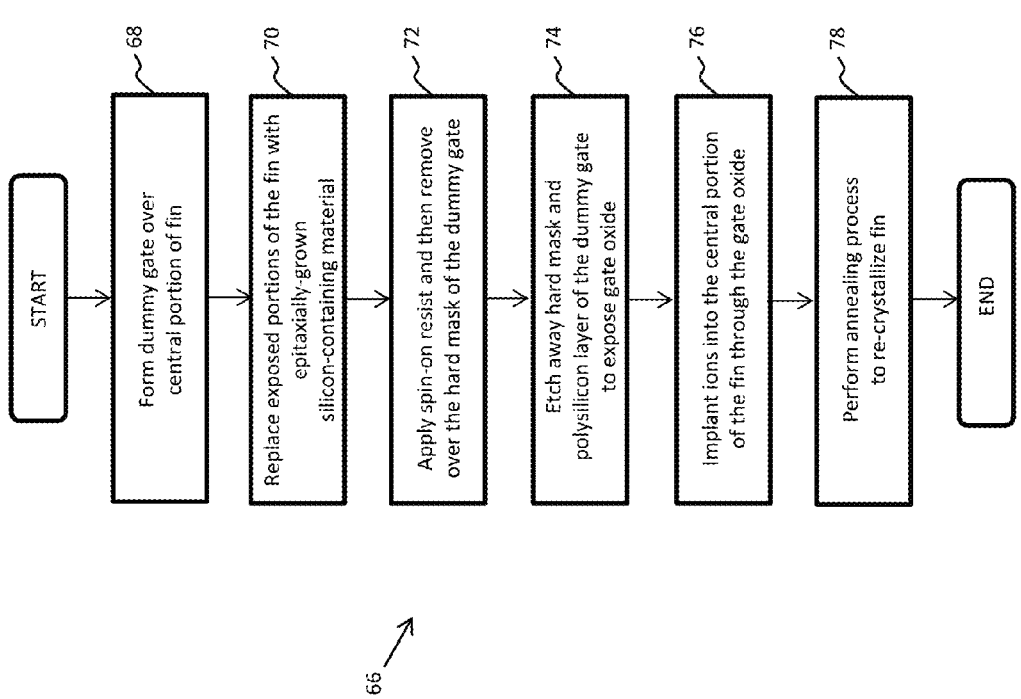
FIG. 15 illustrates an embodiment method of controlling threshold voltages in a fin field effect transistor (FinFET).

Referring now to FIG. 15, an embodiment method 66 of controlling threshold voltages in the FinFET 10 is illustrated. In block 68, the dummy gate 22 is formed over the central portion of the fin 14. As shown in FIG. 1, the central portion 18 of the fin 14 is disposed between exterior portions 20 of the fin unprotected by the dummy gate 22. In block 70, the exterior portions 20 of the fin 14 are removed and replaced with an epitaxially-grown silicon-containing material 24.

In block 72, a spin-on resist 34 is applied over the dummy gate 22 and the epitaxially-grown silicon-containing material 24 and then removed over the hard mask 32 of the dummy gate 22. In block 74, the hard mask 32 and a portion of the polysilicon layer 30 of the dummy gate 22 are etched away to expose the gate oxide 28 of the dummy gate 22 and to form the polysilicon spacers 40. As shown in FIG. 1, the gate oxide 28 is disposed over the central portion 18 of the fin 14. In block 76, ions are implanted into the central portion 18 of the fin 14 through the gate oxide 28 disposed over the central portion 18 of the fin 14. In block 78, an annealing process to repair residual damage in the fin 14 may be performed.

From the foregoing, it should be recognized that the process or processes of forming the embodiment FinFET 10 disclosed herein offer significant advantages. For example, the dopant level or concentration in the fin 14 may be precisely controlled. This is due, at least in part, to encapsulation or protection of the fin 14 with the thin layer of gate oxide 28, the dummy polysilicon spacers 40, and/or the new dummy polysilicon layer (not shown). In addition, the fin 14 may be beneficially encapsulated or protected with the dummy polysilicon spacers 40 and/or the new dummy polysilicon layer (not shown). In addition, the process of forming the embodiment FinFET 10 allows for retaining the stresses from either the epi-$Si_xGe_y$ fins for pFETs and epi-$Si_xC_y$, SiP, and SiCP fins for nFETs.

An embodiment method of controlling threshold voltages in a fin field effect transistor (FinFET) include forming a dummy gate over a central portion of a fin, the central portion of the fin disposed between exterior portions of the fin unprotected by the dummy gate, removing the exterior portions of the fin and replacing the exterior portions of the fin with an epitaxially-grown silicon-containing material, applying a spin-on resist over the dummy gate and the epitaxially-grown silicon-containing material and then removing the spin-on resist over the hard mask of the dummy gate, etching away the hard mask and a polysilicon of the dummy gate to expose a gate oxide of the dummy gate, the gate oxide disposed over the central portion of the fin, and implanting ions into the central portion of the fin through the gate oxide disposed over the central portion of the fin.

An embodiment method of controlling threshold voltages in a fin field effect transistor (FinFET) including forming a dummy gate over a central portion of a fin, the central portion of the fin disposed between exterior portions of the fin unprotected by the dummy gate, removing the exterior portions of the fin and replacing the exterior portions of the fin with an epitaxially-grown silicon-containing material, applying a spin-on resist over the dummy gate and the epitaxially-grown silicon-containing material and then removing the spin-on resist over the hard mask of the dummy gate, etching away the hard mask and a portion of the polysilicon of the dummy gate to expose a gate oxide of the dummy gate and to form polysilicon spacers, the gate oxide disposed over the central portion of the fin, and implanting ions into the central portion of the fin through the gate oxide disposed over the central portion of the fin.

An embodiment method of controlling threshold voltages in a fin field effect transistor (FinFET) including forming a dummy gate over a central portion of a fin, replacing exterior portions of the fin unprotected by the dummy gate with an epitaxially-grown silicon-containing material, applying a spin-on resist over the dummy gate and the epitaxially-grown silicon-containing material and then removing the spin-on resist over the hard mask of the dummy gate, etching away the hard mask and a polysilicon of the dummy gate to expose a gate oxide of the dummy gate, the gate oxide disposed over the central portion of the fin, implanting ions into the central portion of the fin through the gate oxide disposed over the central portion of the fin, and performing an annealing process to re-crystallize the fin.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of controlling threshold voltages in a fin field effect transistor (FinFET), comprising:
    forming a dummy gate over a central portion of a fin, the central portion of the fin disposed between exterior portions of the fin unprotected by the dummy gate;
    removing the exterior portions of the fin and replacing the exterior portions of the fin with an epitaxially-grown silicon-containing material;
    applying a spin-on resist over the dummy gate and the epitaxially-grown silicon-containing material and then removing the spin-on resist over a hard mask of the dummy gate;

etching away the hard mask and a polysilicon of the dummy gate to expose a gate oxide of the dummy gate, the gate oxide disposed over the central portion of the fin; and implanting ions into the central portion of the fin through the gate oxide disposed over the central portion of the fin.

2. The method of claim 1, further comprising removing any of the spin-on resist remaining after the ions have been implanted and then performing an annealing process to re-crystallize the fin.

3. The method of claim 1, further comprising performing the ion implantation at a temperature of between about 25° C. and about 600° C.

4. The method of claim 1, further comprising performing an annealing process to re-crystallize the fin, the annealing process performed immediately after the ion implantation.

5. The method of claim 1, further comprising performing an annealing process to re-crystallize the fin, the annealing process performed while dummy spacers are situated along the gate oxide disposed over the central portion of the fin.

6. The method of claim 1, further comprising performing an annealing process to re-crystallize the fin, the annealing process performed after a protective layer has been formed over the gate oxide disposed over the central portion of the fin.

7. The method of claim 1, further comprising removing the spin-on resist over the hard mask of the dummy gate through chemical down-stream etching.

8. The method of claim 1, further comprising etching away the hard mask through one of dry etching, wet etching, chemical down-stream etching, chemical oxide removal, and combinations thereof.

9. The method of claim 1, further comprising etching away the polysilicon of the dummy gate through one of dry etching, wet etching, chemical down-stream etching, and combinations thereof.

10. The method of claim 1, further comprising forming a lightly doped drain in the central portion of the fin prior to the dummy gate being formed.

11. The method of claim 1, wherein the epitaxially-grown silicon-containing material is silicon germanium (SiGe).

12. The method of claim 1, wherein the epitaxially-grown silicon-containing material is one of silicon doped with carbide (SiC), silicon doped with phosphorus (SiP), and silicon doped with carbon and phosphorus (SiCP).

13. A method of controlling threshold voltages in a fin field effect transistor (FinFET), comprising:
    forming a dummy gate over a central portion of a fin, the central portion of the fin disposed between exterior portions of the fin unprotected by the dummy gate;
    removing the exterior portions of the fin and replacing the exterior portions of the fin with an epitaxially-grown silicon-containing material;
    applying a spin-on resist over the dummy gate and the epitaxially-grown silicon-containing material and then removing the spin-on resist over a hard mask of the dummy gate;
    etching away the hard mask and a portion of a polysilicon of the dummy gate to expose a gate oxide of the dummy gate and to form polysilicon spacers, the gate oxide disposed over the central portion of the fin; and
    implanting ions into the central portion of the fin through the gate oxide disposed over the central portion of the fin.

14. The method of claim 13, further comprising further comprising performing the ion implantation at a temperature of between about 25° C. and about 600° C.

15. The method of claim 13, further comprising performing an annealing process to re-crystallize the fin, the annealing process performed immediately after the ion implantation.

16. The method of claim 13, further comprising performing an annealing process to re-crystallize the fin, the annealing process performed before the polysilicon spacers are removed.

17. A method of controlling threshold voltages in a fin field effect transistor (FinFET), comprising:
    forming a dummy gate over a central portion of a fin;
    replacing exterior portions of the fin unprotected by the dummy gate with an epitaxially-grown silicon-containing material;
    applying a spin-on resist over the dummy gate and the epitaxially-grown silicon-containing material and then removing the spin-on resist over a hard mask of the dummy gate;
    etching away the hard mask and a polysilicon of the dummy gate to expose a gate oxide of the dummy gate, the gate oxide disposed over the central portion of the fin;
    implanting ions into the central portion of the fin through the gate oxide disposed over the central portion of the fin; and
    performing an annealing process to re-crystallize the fin.

18. The method of claim 17, further comprising removing any of the spin-on resist remaining after the ions have been implanted and performing the ion implantation at a temperature of between about 25° C. and about 600° C.

19. The method of claim 17, further comprising performing the annealing process immediately after the ion implantation.

20. The method of claim 17, further comprising performing the annealing process after at least one of dummy spacers and a protective layer have been formed over the gate oxide disposed over the central portion of the fin.

* * * * *